United States Patent
Liu

(10) Patent No.: US 12,027,456 B2
(45) Date of Patent: Jul. 2, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 368 days.

(21) Appl. No.: 17/451,341

(22) Filed: Oct. 19, 2021

(65) Prior Publication Data
US 2022/0059445 A1 Feb. 24, 2022

Related U.S. Application Data

(63) Continuation of application No. PCT/CN2021/100239, filed on Jun. 16, 2021.

(30) Foreign Application Priority Data

Jul. 8, 2020 (CN) .......................... 202010649880.0

(51) Int. Cl.
*H01L 23/498* (2006.01)
*H01L 21/768* (2006.01)
*H01L 21/8234* (2006.01)

(52) U.S. Cl.
CPC .. *H01L 23/49866* (2013.01); *H01L 21/76831* (2013.01); *H01L 21/823468* (2013.01)

(58) Field of Classification Search
CPC ........... H01L 23/49866; H01L 23/5226; H01L 23/481; H01L 23/528; H01L 21/76831; H01L 21/8234
See application file for complete search history.

(56) References Cited

U.S. PATENT DOCUMENTS 6,473,324 B2    10/2002    Fischer et al.
8,557,675 B2 *   10/2013    LiCausi ............ H01L 29/66795
                                                     257/E21.038
(Continued)

FOREIGN PATENT DOCUMENTS

CN    102655151 A    9/2012
CN    105789113 A    7/2016
(Continued)

OTHER PUBLICATIONS

International Search Report as cited in PCT/CN2021/100239 mailed Sep. 15, 2021, 9 pages.

*Primary Examiner* — Jaehwan Oh
*Assistant Examiner* — John M Parker
(74) *Attorney, Agent, or Firm* — Kilpatrick Townsend & Stockton LLP

(57) ABSTRACT

Provided is a manufacturing method of a semiconductor structure, comprising: forming a sacrificial layer on a substrate; forming a trench in the sacrificial layer; forming a first spacer structure in the trench, the first spacer structure at least covering sidewalls of the trench; forming a first conductive structure in the trench; forming a second conductive structure, the second conductive structure covering an outer sidewall of the first spacer structure; forming a second spacer structure, the second spacer structure covering an outer sidewall of the second conductive structure; and forming a third conductive structure, the third conductive structure covering an outer sidewall of the second spacer structure.

15 Claims, 4 Drawing Sheets

(56) References Cited

U.S. PATENT DOCUMENTS

| | | | |
|---|---|---|---|
| 9,882,028 B2* | 1/2018 | Cheng | ................ H01L 21/3086 |
| 11,315,872 B1* | 4/2022 | Park | ................ H01L 21/76816 |
| 2004/0152294 A1 | 8/2004 | Choi | |
| 2007/0148968 A1* | 6/2007 | Kwon | ................ H01L 21/3088 |
| | | | 257/E21.235 |
| 2009/0186485 A1 | 7/2009 | Lam et al. | |
| 2014/0256134 A1 | 9/2014 | Lu et al. | |
| 2015/0340313 A1 | 11/2015 | Choi et al. | |

FOREIGN PATENT DOCUMENTS

| | | |
|---|---|---|
| JP | 2000068376 A | 3/2000 |
| KR | 1020150094073 A | 8/2015 |

* cited by examiner (a)

(b)

SEMICONDUCTOR STRUCTURE AND MANUFACTURING METHOD THEREOF

CROSS-REFERENCE TO RELATED APPLICATIONS

This application is a continuation application of International Patent Application No. PCT/CN2021/100239, filed on Jun. 16, 2021, which claims priority to Chinese Patent Application No. 202010649880.0, filed with the Chinese Patent Office on Jul. 8, 2020 and entitled "SEMICONDUCTOR STRUCTURE AND MANUFACTURING METHOD THEREOF." International Patent Application No. PCT/CN2021/100239 and Chinese Patent Application No. 202010649880.0 are incorporated herein by reference in their entireties.

TECHNICAL FIELD

The present disclosure relates to the field of integrated circuit technologies, and in particular, to a semiconductor structure and a manufacturing method thereof.

BACKGROUND

As a key dimension of a semiconductor memory continues to decrease, the integration of a device structure is getting higher and higher, and especially in a manufacturing process of a DRAM (Dynamic Random Access Memory) with a small key dimension, a margin of an etching process is also reduced accordingly. For example, in a peripheral circuit structure MO in which a sense amplifier (SA), a sub-wordline driver (SWD), and the like are formed, the spacing of a wiring pattern is rapidly reduced, which makes it difficult to perform metal wiring using a patterning process.

SUMMARY

According to various embodiments, a semiconductor structure and a manufacturing method thereof are provided.

The first aspect of the present application provides a manufacturing method of a semiconductor structure, comprising:
  providing a substrate;
  forming a sacrificial layer on the substrate;
  forming a trench in the sacrificial layer;
  forming a first spacer structure in the trench, the first spacer structure at least covering sidewalls of the trench;
  forming a first conductive structure in the trench;
  forming a second conductive structure, the second conductive structure covering the sidewall of the first spacer structure which is far from the first conductive structure;
  forming a second spacer structure, the second spacer structure covering the sidewall of the second conductive structure which is far from the first spacer structure; and
  forming a third conductive structure, the third conductive structure covering the sidewall of the second spacer structure which is far from the second conductive structure.

The second aspect of the present application provides a semiconductor structure formed by the manufacturing method of a semiconductor structure according to any one of the above embodiments is further provided. The semiconductor structure includes: a substrate, a first conductive structure, a second conductive structure, and a third conductive structure;
  wherein the first conductive structure, the second conductive structure, and the third conductive structure are arranged on a surface of the substrate at intervals, and the second conductive structure is located between the first conductive structure and the third conductive structure.

BRIEF DESCRIPTION OF DRAWINGS

In order to more clearly illustrate the technical solutions in the embodiments of the present disclosure or in traditional technologies, drawings to be used for description of embodiments or the traditional technologies will be described briefly hereinafter. Obviously, drawings referred to in the following description are merely some embodiments of the present disclosure, and those skilled in the art may also obtain other drawings based on these drawings without paying creative efforts.

DESCRIPTION OF EMBODIMENTS

Figure 1:
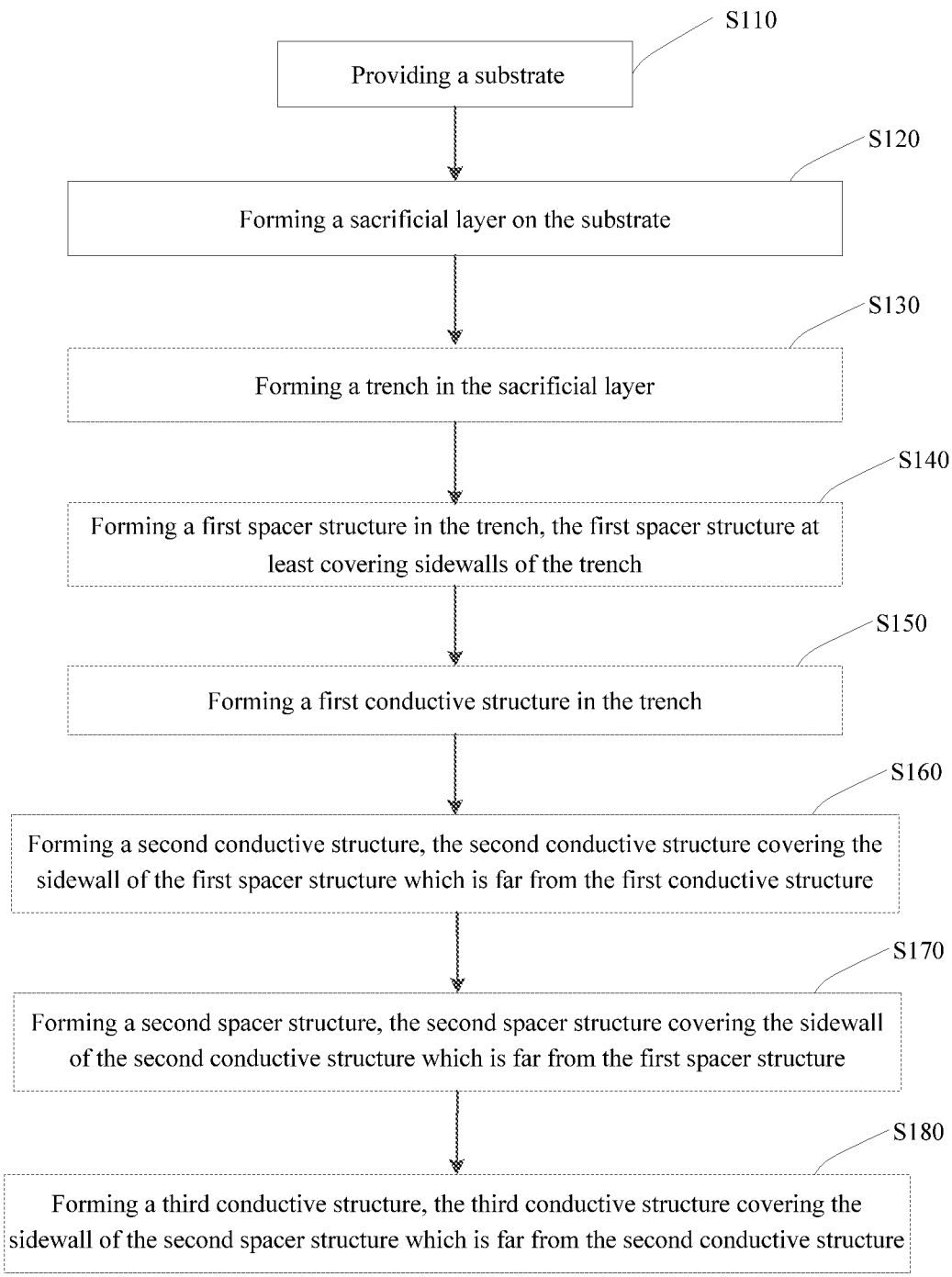
FIG. 1 is a flowchart of a manufacturing method of a semiconductor structure according to an embodiment.

For easy understanding of the present disclosure, a more comprehensive description of the present disclosure will be given below with reference to the relevant accompanying drawings. Embodiments of the present disclosure are given in the drawings. However, the present disclosure may be implemented in many different forms and is not limited to the embodiments described herein. Rather, these embodiments are provided to make the contents disclosed in the present disclosure more thorough and comprehensive.

Unless otherwise defined, all technical and scientific terms used herein have the same meaning as commonly understood by those skilled in the technical field to which the present disclosure belongs. The terms used herein in the specification of the present disclosure are for the purpose of describing specific embodiments only but not intended to limit the present disclosure.

Spatial relationship terms such as "under", "below", "beneath", "above", and "on" here can be used to describe the relationship between one element or feature shown in the figures and other elements or features. It should be understood that in addition to the orientations shown in the figures, the spatial relationship terms also include different orientations of devices in use and operation. In addition, the embodiment of the present disclosure is described here with reference to a cross-sectional view which is a schematic diagram of an ideal embodiment (and intermediate structure) of the present disclosure, so that changes in the shown shape due to, for example, manufacturing technologies and/or tolerances can be expected. Therefore, the embodiments of the present disclosure should not be limited to the specific shapes of the regions shown here, but include shape deviations due to, for example, manufacturing technologies.

Referring to FIG. 1, according to an embodiment, a manufacturing method of a semiconductor structure is provided, including the following steps:

step S110, providing a substrate 100;

step S120, forming a sacrificial layer 200 on the substrate 100;

step S130, forming a trench 210 in the sacrificial layer 200;

step S140, forming a first spacer structure 300 in the trench 210, the first spacer structure 300 at least covering sidewalls of the trench 210;

step S150, forming a first conductive structure 400 in the trench 210;

step S160, forming a second conductive structure 500, the second conductive structure 500 covering the sidewall of the first spacer structure 300 which is far from the first conductive structure 400;

step S170, forming a second spacer structure 600, the second spacer structure 600 covering the sidewall of the second conductive structure 500 which is far from the first spacer structure 300; and step S180, forming a third conductive structure 700, the third conductive structure 700 covering the sidewall of the second spacer structure 600 which is far from the second conductive structure 500.

It can be understood that the layout of a core region is limited by the wordline/bitline spacing. As the key dimensions decrease, a patterning process used during the formation of metal wiring corresponding to the core region is also limited. The traditional use of an inverse self-aligned double patterning process has been unable to achieve wiring well. For this reason, in this embodiment, the trench 210 is first formed in the sacrificial layer 200, and then the first spacer structure 300 and the first conductive structure 400 are sequentially formed in the trench 210. In this way, the size of a mask used in the photolithography process is increased to the sum of the width of the first conductive structure 400 and the width of two first spacer structures 300 and the restriction on the photolithography process is reduced, thereby solving the problem of difficult metal wiring in a peripheral circuit structure caused by the reduction of key dimensions, and also improving product quality.

In this embodiment, the substrate 100 includes a conductor substrate, as well as a wordline structure, a bitline structure, and a capacitor structure sequentially formed on the conductor substrate. The conductor substrate may be, but is not limited to, a silicon substrate, an epitaxial silicon substrate, a silicon germanium substrate, a silicon carbide substrate, or a silicon-coated insulating substrate.

In one of the embodiments, the first conductive structure 400 is configured as a pad, and the second conductive structure 500 and the third conductive structure 700 are both configured as conductive leads. In this embodiment, the second conductive structure 500 and the third conductive structure 700 are both connected to the pad, and provide data received by the pad to the corresponding wordline or bitline structure.

Figure 2:
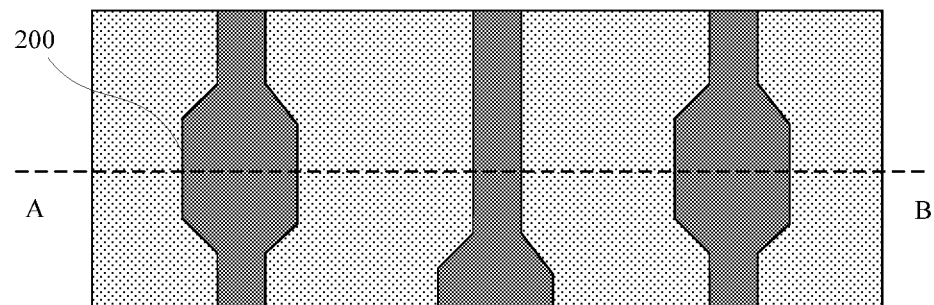
FIGS. 2 to 8 are schematic cross-sectional structural diagrams of a structure obtained in a manufacturing method of a semiconductor structure according to an embodiment.
Figure 2:
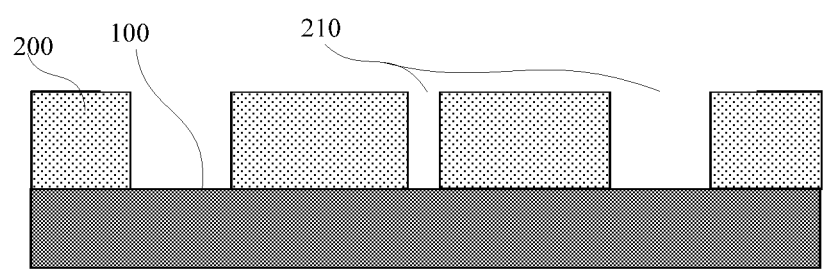

Referring to FIG. 2, FIG. 2 (a) is a schematic top view of the structure after the trench 210 is formed, and FIG. 2 (b) is a schematic cross-sectional structural diagram taken along a dotted line AB in FIG. 2 (a). In one of the embodiments, the trench 210 includes a first region 211 and a second region 212, wherein a width of the first region 211 is greater than a width of the second region 212, and the first conductive structure 400 is formed in the first region 211.

Specifically, in this embodiment, the step of forming the trench 210 specifically includes the following.

First, a deposition process is carried out to deposit a sacrificial material on the substrate 100 to form the sacrificial layer 200. In this embodiment, a thickness of the sacrificial layer 200 is determined by a height of the first conductive structure 400 to be formed. Specifically, the sacrificial layer 200 may be made of a material such as silicon oxide and silicon nitride, wherein the deposition process may be CVD (Chemical Vapor Deposition), low-pressure CVD (LPCVD), plasma enhanced CVD (PECVD), atomic layer deposition (ALD, or plasma enhanced ALD (PEALD).

Second, a patterned mask layer is formed on the sacrificial layer 200, an opening that exposes the sacrificial layer 200 is formed in the patterned mask layer, and the opening defines the shape and position of the trench 210. The patterned mask layer may be configured as a patterned photoresist layer or a patterned hard mask layer. When the patterned mask layer is configured as a patterned photoresist layer, the step of forming the patterned mask layer specifically includes: coating the sacrificial layer 200 with photoresist to form a photoresist layer, and then using a laser device to irradiate the photoresist layer through a photomask to cause a chemical reaction of the photoresist in the exposed region; then, carrying out a development process to dissolve and remove the photoresist in the exposed region (called positive photoresist) or the photoresist in unexposed region (called negative photoresist), and transferring the pattern from the photomask to the photoresist layer, thus forming the patterned mask layer. When the patterned mask layer is configured as a patterned hard mask layer, a hard mask layer may be first formed on the sacrificial layer 200, and then a photoresist layer may be formed on the hard mask layer, and then the photoresist layer may be exposed and developed by an exposure and development process to obtain a patterned photoresist layer; then, based on the patterned photoresist layer, the hard mask layer is etched to form the patterned hard mask layer.

Finally, the sacrificial layer 200 is etched based on the patterned mask layer to form the trench 210, and the bottom of the trench 210 exposes the substrate 100.

After the trench 210 is formed, a step of removing the patterned mask layer is further included. Specifically, when the patterned mask layer is configured as a patterned hard mask layer, the patterned mask layer can be removed by a chemical mechanical polishing process, an etching process or a combination of a chemical mechanical polishing process and an etching process; when the patterned mask layer is configured as a patterned photoresist layer, the patterned mask layer can be removed by an ashing process.

In one of the embodiments, the step of forming the first spacer structure 300 includes:

forming a first isolation material layer through a deposition process, the first isolation material layer covering the sidewalls and bottom of the trench 210 and a top of the sacrificial layer 200 and filling up the second region 212 of the trench 210; and performing chemical mechanical polishing or etching on the first isolation material layer to remove the first isolation material layer covering the bottom of the trench 210 and the top of the sacrificial layer 200, the first isolation material layer covering the sidewalls of the trench 210 being retained, thus forming the first spacer structure 300.

Figure 3:
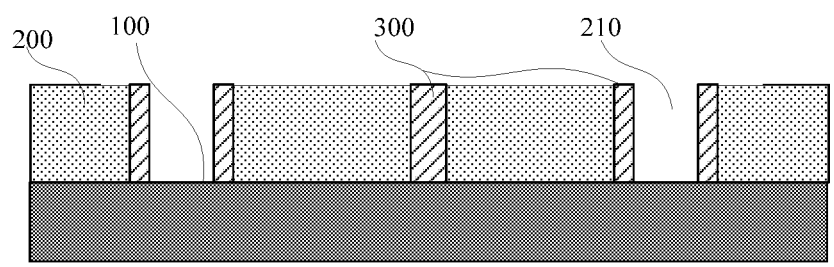

Referring to FIG. 3, in this embodiment, the first conductive structure 400 is configured as a pad, and the second conductive structure 500 and the third conductive structure 700 are both configured as conductive leads. Since the pad is shorter than the conductive lead, only the width of the trench 210 needs to be increased in the region where the pad is arranged. Specifically, when the sacrificial layer 200 is made of silicon oxide, a silicon nitride material may be deposited by a deposition process to form the first isolation material layer, and the first isolation material layer covers the sidewalls and bottom of the trench 210 and the top of the sacrificial layer 200 and fills up the second region 212 of the trench 210; then, the first isolation material layer covering the bottom of the trench 210 and the top of the sacrificial layer 200 is removed by using an etch-back or chemical mechanical polishing process, and the first isolation material layer covering the sidewalls of the trench 210 is retained, thus forming the first spacer structure 300.

It should be noted that, in order to fill up the second region 212, the width of the first spacer structure 300 formed in the first region 211 by the deposition process is greater than or equal to the width of the first spacer structure 300 in the second region 212. Therefore, in a direction perpendicular to the extension of the trench 210, a difference between the width of the trench 210 in the first region 211 and the width of the trench 210 in the second region 212 is greater than or equal to the width of the first conductive structure 400 to be formed.

In one of the embodiments, the step of forming the first conductive structure 400 includes:
  forming a first conductive material layer, the first conductive material layer filling up the first region 211 of the trench 210 and covering the top of the sacrificial layer 200 and a top of the first spacer structure; and
  removing the first conductive material layer covering the top of the sacrificial layer 200 and the top of the first spacer structure to form the first conductive structure 400, a top of the first conductive structure 400 being flush with the top of the first spacer structure 300.

Figure 4:
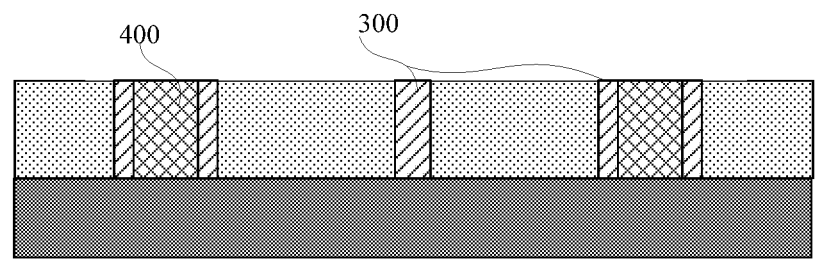

Referring to FIG. 4, the specific process of forming the first conductive structure 400 in the embodiment of the present invention includes: carrying out a deposition process to deposit a conductive material, e.g., a metal material such as tungsten and nickel on the substrate 100 on which the first spacer structure 300 is formed to form a first conductive material layer, the first conductive material layer filling up the first region 211 of the trench 210 and covering the top of the sacrificial layer 200 and the top of the first spacer structure; and then removing the first conductive material layer covering the top of the sacrificial layer 200 and the top of the first spacer structure by using an etch-back or chemical mechanical polishing process to form the first conductive structure 400, the top of the first conductive structure 400 being flush with the first spacer structure 300.

In one of the embodiments, the step of forming the second conductive structure 500 includes:
  removing the sacrificial layer 200;
  forming a second conductive material layer by deposition, the second conductive material layer covering the top of the substrate 100, the top of the first spacer structure 300 and the top of the first conductive structure 400, and the outer sidewall of the first spacer structure 300; and
  removing the second conductive material layer covering the top of the substrate 100, the top of the first spacer structure 300 and the top of the first conductive structure 400, the second conductive material layer covering the outer sidewall of the first spacer structure 300 being retained, thus forming the second conductive structure 500.

Figure 5:
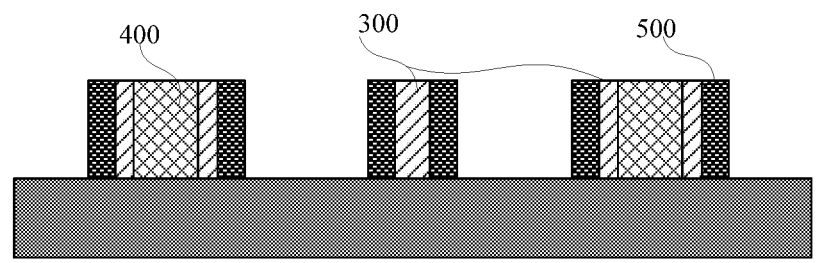

Referring to FIG. 5, after the formation of the first conductive structure 400, the sacrificial layer 200 is firstly removed. Since the sacrificial layer 200 in this embodiment is made of a silicon oxide material and the first isolation structure is made of a silicon nitride material, the sacrificial layer 200 can be removed by using a etch selectivity ratio of the silicon oxide material to the silicon nitride material. Secondly, a deposition process is carried out to deposit a conductive material, e.g., a metal material such as tungsten and nickel to form a second conductive material layer, and the second conductive material layer covers the top of the substrate 100, the top of the first spacer structure 300, the top of the first conductive structure 400, and the outer side wall of the first spacer structure 300. Finally, an etch-back process is carried out on the second conductive material layer to remove the second conductive material layer covering the top of the substrate 100, the top of the first spacer structure 300, and the top of the first conductive structure 400, but the second conductive material layer covering the outer side wall of the first spacer structure 300 is retained, thus forming the second conductive structure 500.

Figure 6:
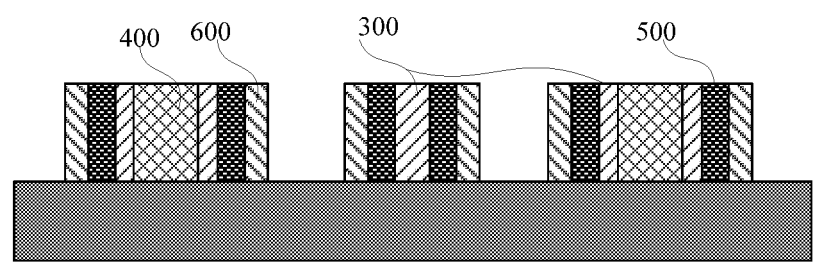

Referring to FIG. 6, in one of the embodiments, the process of forming the second spacer structure 600 specifically includes the following:
  firstly, on the substrate 100 on which the second conductive structure 500 is formed, carrying out a deposition process to deposit a silicon nitride material to form a second isolation material layer, the second isolation material layer covering the top of the substrate 100, the top of the first conductive structure 400, the top of the first spacer structure 300, and the top of the second conductive structure 500 and further covering the sidewall of the second conductive structure 500 which is far from the first spacer structure 300; and
  secondly, carrying out a chemical mechanical polishing or etch-back process on the second isolation material layer to remove the second isolation material layer covering the top of the substrate 100, the top of the first conductive structure 400, the top of the first spacer structure 300, and the top of the second conductive structure 500, the second isolation material layer covering the sidewall of the second conductive structure 500 which is far from the first spacer structure 300 being retained, thus forming the second spacer structure 600.

Figure 7:
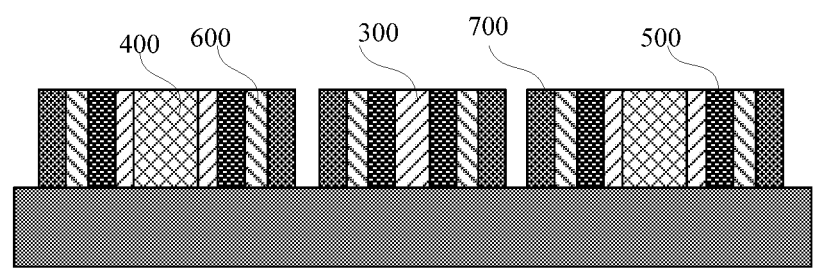

Referring to FIG. 7, in one of the embodiments, the process of forming the third conductive structure 700 specifically includes: firstly, carrying out a deposition process to deposit a conductive material, e.g., a metal material such as tungsten and nickel to form a third conductive material layer, the third conductive material layer covering the top of the substrate 100, the top of the first spacer structure 300, the top of the first conductive structure 400, the top of the second conductive structure 500, the top of the second spacer structure 600, and the sidewall of the second spacer structure 600 which is far from the first spacer structure 300; finally, carrying out a chemical mechanical polishing or etch-back process on the third conductive material layer to remove the third conductive material layer the top of the substrate 100, the top of the first spacer structure 300, the top of the first conductive structure 400, the top of the second conductive structure 500, and the top of the second spacer structure 600, the third conductive material layer covering the outer sidewall of the first spacer structure 300 being retained, thus forming the third conductive structure 700.

In one of the embodiments, the line widths of the second conductive structure and the third conductive structure are both within a range of 10 nm to 50 nm; specifically, the line widths of the second conductive structure and the third conductive structure may be 10 nm, 20 nm, 30 nm, 40 nm, 50 nm or the like. By using the manufacturing method according to the present disclosure, the line widths of the second conductive structure and the third conductive structure can be controlled within the range of 10 nm to 50 nm, which reduces an internal resistance on the conductive leads and also satisfies the limitation of wordline/bitline spacing. The spacing distance between the conductive leads is specifically determined by the thickness of the spacer structure between the two conductive leads.

In one of the embodiments, the first conductive structure 400, the second conductive structure 500, and the third conductive structure 700 are all made of a metal conductive material. It can be understood that the use of the first conductive structure 400, the second conductive structure 500, and the third conductive structure 700 which are all made of a metal conductive material can reduce the internal resistance on the conductive lead, maintain a good timing consistency of signal transmission, and facilitate the reduction of the difficulty in material management, thereby reducing production costs.

Figure 8:
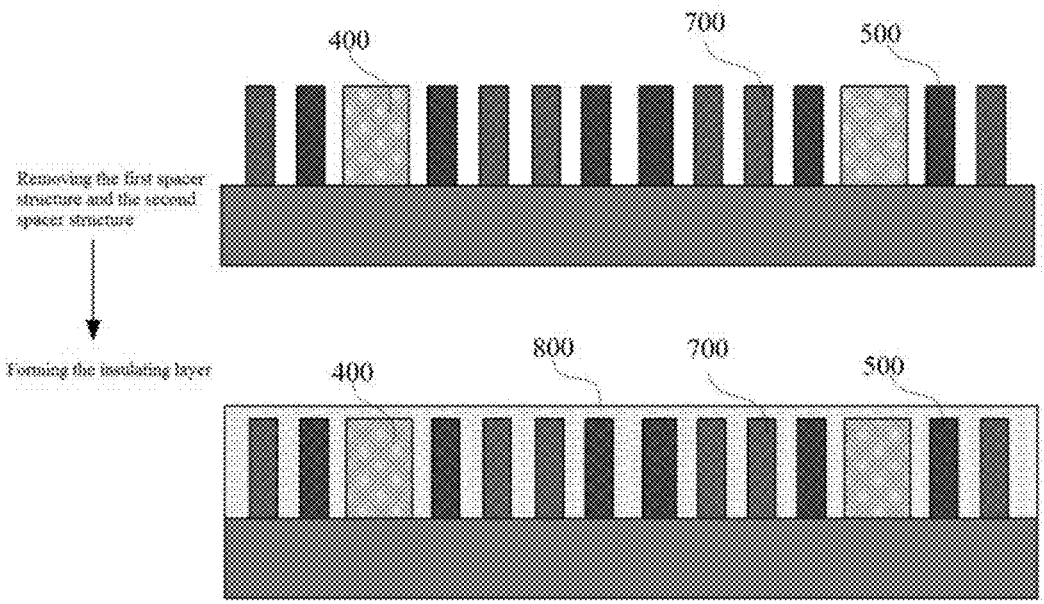

Referring to FIG. 8, in one of the embodiments, the manufacturing method of a semiconductor structure further includes:

removing the first spacer structure and the second spacer structure to form a to-be-filled region; and forming an insulating layer 800, the insulating layer 800 filling the to-be-filled region and covering the top of the first conductive structure 400, the top of the second conductive structure 500, and the top of the third conductive structure 700.

It can be understood that in the process of forming the first spacer structure 300 and the second spacer structure 600, in order to facilitate the production, a material with poor insulativity and/or a low dielectric coefficient may be used. Therefore, if the first spacer structure 300 and the second spacer structure 600 are used as insulating structures, dark current and/or parasitic capacitance may be generated, so a new insulating layer 800 needs to be formed. In some other embodiments, if the materials of the first spacer structure 300 and the second spacer structure 600 have good insulativity and a higher dielectric constant, the first spacer structure 300 and the second spacer structure 600 can also be retained.

Figure 9:
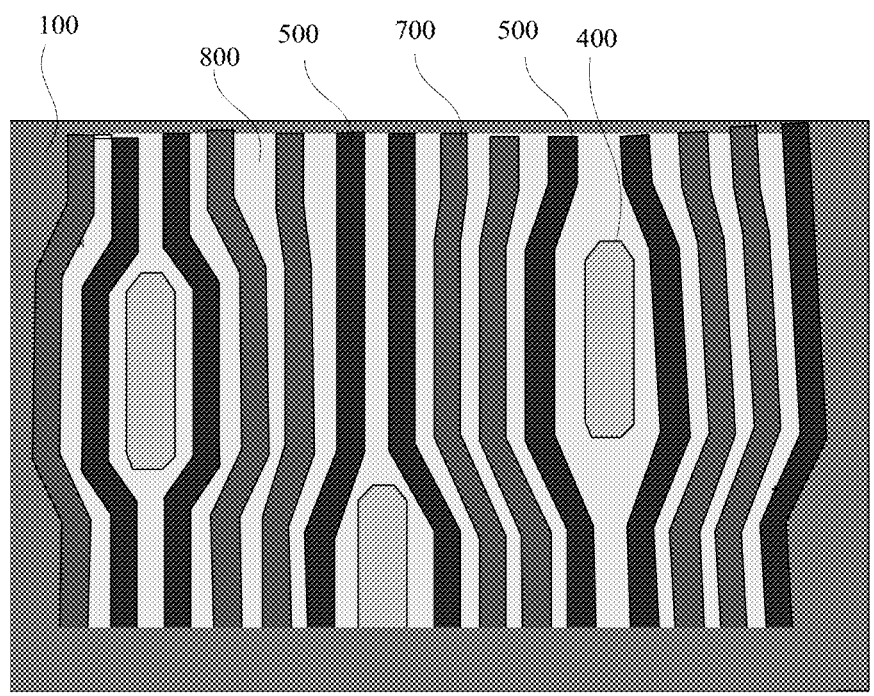
FIG. 9 is a top view of a semiconductor structure according to an embodiment.

Based on the same inventive concept, an embodiment further provides a semiconductor structure formed by the manufacturing method of a semiconductor structure according to any one of the above embodiments. Referring to FIG. 9, the semiconductor structure includes: a substrate 100, a first conductive structure 400, a second conductive structure 500, and a third conductive structure 700.

The first conductive structure 400, the second conductive structure 500, and the third conductive structure 700 are arranged on a surface of the substrate at intervals, and the second conductive structure 500 is located between the first conductive structure 400 and the third conductive structure 700.

In this embodiment, the substrate 100 includes a conductor substrate, as well as a wordline structure, a bitline structure, and a capacitor structure sequentially formed on the conductor substrate. The conductor substrate may be, but is not limited to, a silicon substrate, an epitaxial silicon substrate, a silicon germanium substrate, a silicon carbide substrate, or a silicon-coated insulating substrate.

In one of the embodiments, the semiconductor structure further includes an insulating layer 800, the insulating layer fills a region among the first conductive structure 400, the second conductive structure 500, and the third conductive structure 700, and covers a top of the first conductive structure 400, a top of the second conductive structure 500, and a top of the third conductive structure 700. In this embodiment, the first conductive structure 400, the second conductive structure 500, and the third conductive structure 700 are insulated by the insulating layer 800 to prevent the generation of dark current and/or parasitic capacitance; in addition, the insulating layer 800 also supports the first conductive structure 400, the second conductive structure 500, and the third conductive structure 700 and prevents the first conductive structure 400, the second conductive structure 500, and the third conductive structure 700 from falling or collapsing due to an external force.

In one of the embodiments, the first conductive structure 400 is configured as a pad, and the second conductive structure 500 and the third conductive structure 700 are both configured as conductive leads. In this embodiment, the second conductive structure 500 and the third conductive structure 700 are both connected to the pad, and provide data received by the pad to the corresponding wordline or bitline structure.

In one of the embodiments, the line widths of the second conductive structure and the third conductive structure are both within a range of 10 nm to 50 nm; specifically, the line widths of the second conductive structure and the third conductive structure may be 10 nm, 20 nm, 30 nm, 40 nm, 50 nm or the like. By using the manufacturing method according to the present disclosure, the line widths of the second conductive structure and the third conductive structure can be controlled within the range of 10 nm to 50 nm, which reduces an internal resistance on the conductive leads and also satisfies the limitation of wordline/bitline spacing. The spacing distance between the conductive leads is specifically determined by the thickness of the spacer structure between the two conductive leads.

In summary, this embodiment provides a semiconductor structure and a manufacturing method thereof, wherein the manufacturing method includes: providing a substrate 100; forming a sacrificial layer 200 on the substrate 100; forming a trench 210 in the sacrificial layer 200; forming a first spacer structure 300 in the trench 210, the first spacer structure 300 at least covering sidewalls of the trench 210; forming a first conductive structure 400 in the trench 210; forming a second conductive structure 500, the second conductive structure 500 covering the sidewall of the first spacer structure 300 which is far from the first conductive structure 400; forming a second spacer structure 600, the second spacer structure 600 covering the sidewall of the second conductive structure 500 which is far from the first spacer structure 300; and forming a third conductive structure 700, the third conductive structure 700 covering the sidewall of the second spacer structure 600 which is far from the second conductive structure 500. In the above method, the trench 210 is first formed in the sacrificial layer 200, and then the first spacer structure 300 and the first conductive structure 400 are sequentially formed in the trench 210. In this way, the size of a mask used in the photolithography process is increased to the sum of the width of the first conductive structure 400 and the width of two first spacer structures 300 and the restriction on the photolithography process is reduced, thereby solving the problem of difficult metal wiring in a peripheral circuit structure caused by the reduction of key dimensions, and also improving product quality.

In the description of the present specification, the description with reference to the terms such as "one of the embodiments", "some other embodiments", etc. means that the specific feature, structure, material, or feature described in conjunction with the embodiment or example is included in at least one of embodiments or example of the present disclosure. In the present disclosure, the schematic description of the above-mentioned terms does not necessarily refer to the same embodiment or example.

The technical features of the above-described embodiments may be arbitrarily combined. In order to make the description concise, all possible combinations of the technical features of the above-mentioned embodiments are not described. However, as long as there is no contradiction in the combination of these technical features, it should be regarded as falling within the scope of the present disclosure.

The above-described embodiments only show several implementation ways of the present disclosure, which are more specific and detailed, but not to be construed as limiting the scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A manufacturing method of a semiconductor structure, comprising:
    providing a substrate;
    forming a sacrificial layer on the substrate;
    forming a trench in the sacrificial layer;
    forming a first spacer structure in the trench, the first spacer structure at least covering sidewalls of the trench;
    forming a first conductive structure in the trench;
    forming a second conductive structure, the second conductive structure covering the sidewall of the first spacer structure which is facing away from the first conductive structure;
    forming a second spacer structure, the second spacer structure covering the sidewall of the second conductive structure which is facing away from the first spacer structure; and
    forming a third conductive structure, the third conductive structure covering the sidewall of the second spacer structure which is facing away from the second conductive structure.

2. The method according to claim 1, wherein
    the first conductive structure is configured as a pad, and the second conductive structure and the third conductive structure are both configured as conductive leads.

3. The method according to claim 1, wherein
    the trench comprises a first region and a second region, wherein a width of the first region is greater than a width of the second region, and the first conductive structure is formed in the first region.

4. The method of claim 3, wherein
    the forming the first spacer structure comprises:
        forming a first isolation material layer through a deposition process, the first isolation material layer covering the sidewalls and bottom of the trench and a top of the sacrificial layer and filling up the second region of the trench; and
        etching the first isolation material layer to remove the first isolation material layer covering the bottom of the trench and the top of the sacrificial layer, the first isolation material layer covering the sidewalls of the trench being retained, thus forming the first spacer structure.

5. The method according to claim 3, wherein
    the forming the first conductive structure comprises:
        forming a first conductive material layer, the first conductive material layer filling up the first region of the trench and covering a top of the sacrificial layer and a top of the first spacer structure; and
        removing the first conductive material layer covering the top of the sacrificial layer and the top of the first spacer structure to form the first conductive structure, a top of the first conductive structure being flush with the top of the first spacer structure.

6. The method according to claim 1, wherein
    the forming the second conductive structure comprises:
        removing the sacrificial layer;
        forming a second conductive material layer by deposition, the second conductive material layer covering a top of the substrate, a top of the first spacer structure, a top of the first conductive structure, and an outer sidewall of the first spacer structure; and
        removing the second conductive material layer covering the top of the substrate, the top of the first spacer structure and the top of the first conductive structure, the second conductive material layer covering the outer sidewall of the first spacer structure being retained, thus forming the second conductive structure.

7. The method according to claim 1, wherein
    line widths of the second conductive structure and the third conductive structure are both in a range of 10 nm to 50 nm.

8. The method according to claim 1, wherein
    the first conductive structure, the second conductive structure, and the third conductive structure are all made of a metal conductive material.

9. The method according to claim 1, further comprising:
    removing the first spacer structure and the second spacer structure to form a to-be-filled region; and
    forming an insulating layer, the insulating layer filling the to-be-filled region and covering a top of the first conductive structure, a top of the second conductive structure, and a top of the third conductive structure.

10. A semiconductor structure formed by the method according to claim 1, the semiconductor structure comprising
    the substrate, the first conductive structure, the second conductive structure, and the third conductive structure,
    wherein the first conductive structure, the second conductive structure, and the third conductive structure are arranged on a surface of the substrate at intervals, and the second conductive structure is located between the first conductive structure and the third conductive structure.

11. The semiconductor structure according to claim 10, further comprising
    an insulating layer, the insulating layer filling a region among the first conductive structure, the second conductive structure, and the third conductive structure and covering a top of the first conductive structure, a top of the second conductive structure, and a top of the third conductive structure.

12. The semiconductor structure according to claim 11, wherein
    line widths of the second conductive structure and the third conductive structure are both in a range of 10 nm to 50 nm.

13. The semiconductor structure according to claim 10, wherein
   the first conductive structure is configured as a pad, and the second conductive structure and the third conductive structure are configured as leads.

14. The semiconductor structure according to claim 13, wherein
   line widths of the second conductive structure and the third conductive structure are both in a range of 10 nm to 50 nm.

15. The semiconductor structure according to claim 10, wherein
   line widths of the second conductive structure and the third conductive structure are both in a range of 10 nm to 50 nm.

* * * * *